United States Patent [19]
Morimoto

[11] Patent Number: 5,926,425
[45] Date of Patent: Jul. 20, 1999

[54] MEMORY WITH BIT LINE DISCHARGE CIRCUIT ELEMENTS

[75] Inventor: Tatsuo Morimoto, Tokyo, Japan

[73] Assignees: Mitsubishi Electric Engineering Co., Ltd.; Mitsubishi Denki Kabushiki Kaisha

[21] Appl. No.: 08/941,564

[22] Filed: Sep. 30, 1997

[30] Foreign Application Priority Data

May 16, 1997 [JP] Japan ..................................... 9-127049

[51] Int. Cl.⁶ ...................................................... G11C 7/00
[52] U.S. Cl. ........................................... 365/204; 365/203
[58] Field of Search .................... 365/203, 204, 365/190, 104, 149

[56] References Cited

U.S. PATENT DOCUMENTS

| | | | |
|---|---|---|---|
| 5,079,742 | 1/1992 | Simpson | 365/104 |
| 5,388,078 | 2/1995 | Arakawa | 365/203 |
| 5,535,160 | 7/1996 | Yamaguchi | 365/189.01 |
| 5,703,820 | 12/1997 | Kohno | 365/204 |
| 5,757,709 | 5/1998 | Suminaga et al. | 365/204 |

*Primary Examiner*—Son Mai
*Attorney, Agent, or Firm*—Burns, Doane, Swecker & Mathis, LLP

[57] ABSTRACT

A memory which solves a problem of a conventional memory in that it was difficult for the conventional memory to shorten the fall time of its output signal without increasing its size. The number of paths is increased for discharging each of read bit lines by connecting to each of the read bit lines one or more additional transistors for discharging the read bit line, and by utilizing the transistors associated with other read bit line or lines to discharge the particular read bit line. The additional transistors can be provided between the existing transistors. This makes it possible to shorten the discharge time without increasing the size of the memory.

4 Claims, 9 Drawing Sheets

MEMORY WITH BIT LINE DISCHARGE CIRCUIT ELEMENTS

BACKGROUND OF THE INVENTION

1. Field of the Invention

The present invention relates to a memory such as a ROM (read-only memory) or a DRAM (dynamic random-access memory).

2. Description of Related Art

FIG. 8 is a circuit diagram showing a part of a circuit configuration of a conventional memory. In this figure, the reference numerals 1 and 2 designate read bit lines, 3 and 4 designate read word lines to which read word select signals $W_1$ and $W_2$ are applied, respectively. The reference numerals 5 and 6 designate column select lines to which column select signals $C_1$ and $C_2$ are applied. The reference numerals 7 and 8 designate transistors connected in series with the read bit lines 1 and 2 for selecting the read bit lines 1 and 2, respectively. The transistor 7 and 8 have their gates connected to the column select lines 5 and 6, respectively.

The reference numeral 9 designates a common read bit line with its first end connected to the read bit lines 1 and 2 in common, and 10 designates a transistor for supplying charge to the common read bit line 9. The transistor 10 has its drain connected to the common read bit line 9 and its source connected to a supply voltage $V_{DD}$. The reference numeral 11 designates an inverter whose input terminal is supplied with a chip enable control signal CEC and whose output terminal is connected to the gate of the transistor 10.

The reference numerals 12 and 13 designate inverters for amplifying the potential of the read bit lines 1 and 2. The inverter 12 has its input terminal connected to the common read bit line 9 and its output terminal to the input terminal of the inverter 13 which produces an output signal $D_0$ from its output terminal. The reference numeral 14 designates a transistor for holding the input potential to the inverter 12. The transistor 14 has its gate connected to the output terminal of the inverter 12, its drain connected to the input terminal of the inverter 12, and its source connected to the supply voltage $V_{DD}$.

The reference characters $M_1$–$M_4$ designate transistors constituting the memory. The transistors $M_1$ and $M_4$ have their drains connected to the read bit lines 1 and 2, respectively. The transistors $M_2$ and $M_3$ have their sources open, and their drains connected to the read bit lines 2 and 1, respectively. In addition, the transistors $M_1$ and $M_2$ have their gates connected to the read word line 3, and the transistors $M_3$ and $M_4$ have their gates connected to the read word line 4.

FIG. 9 is a plan view showing the physical structure of the conventional memory in part, and FIG. 10 is a longitudinal sectional perspective view taken along the line B—B of FIG. 9. In FIGS. 9 and 10, portions corresponding to those of FIG. 8 are designated by the same reference numerals, and the description thereof is omitted here.

In FIGS. 9 and 10, the reference numerals 21 and 22 designate contact holes for contacting the metallic read bit lines 1 and 2 with the diffusion regions of the transistors $M_1$ and $M_2$, respectively, 23 designates a substrate, and 31 and 32 designate the diffusion regions of the transistors $M_1$ and $M_2$.

FIG. 11 is a timing chart illustrating waveforms of signals input to or output from the conventional memory. The operation of the memory will now be described with reference to the timing chart of FIG. 11.

First, the read bit line 2 is charged through transistors 10 and 8 during the interval in which the chip enable control signal CEC and the column select signal $C_2$ are placed at a high level, so that the potential of the read bit line 2, which will be denoted as bit2, is placed at the high level. In the course of this, the potential of the read bit line 1, denoted as bit1, is in a floating state because the column select signal $C_1$ is placed at a low level and hence the transistor 7 is nonconducting. The output signal $D_0$ of the inverter 13 is at the high level because the high potential of the common read bit line 9 is inverted twice by the inverters 12 and 13.

When the column select signal $C_1$ rises to the high level and the column select signal $C_2$ falls to the low level in this state, the transistor 7 is turned on, and the transistor 8 is turned off. Accordingly, the potential bit1 rises to the high level so that the read bit line 1 is charged, and the potential bit2 is maintained at the high level.

When the chip enable control signal CEC falls in this state, the transistor 10 is turned off and the power supply to the common read bit line 9 is ceased. Subsequently, when the read word line select signal $W_1$ rises, the transistors $M_1$ and $M_2$ conduct. Hence, the read bit line 1 is discharged through the transistor $M_1$, and the potential bit1 and the output signal $D_0$ fall to the low level. In this case, the potential bit1 gradually falls because the read bit line 1 is discharged rather slowly through the transistor $M_1$.

Next, when the chip enable control signal CEC rises again, and the read word line select signal $W_1$ falls, the transistor 10 is turned on and the transistors $M_1$ and $M_2$ are turned off, and the common read bit line 9 is supplied with the supply voltage $V_{DD}$ through the transistor 10. Since the transistor 7 is conducting and the transistor 8 is nonconducting in this case, the potential bit1 and the output signal $D_0$ rise to the high level, again.

Even when the column select signal $C_1$ falls to the low level and the column select signal $C_2$ rises to the high level in this state, both the potentials bit1 and bit2 are kept at the high level because the potential bit1 has already been placed at the high level.

With such an arrangement, the time period taken by the output signal $D_0$ to fall to the low level in the conventional memory is substantially determined by the discharge time through the transistor $M_1$. Although increasing the size of the transistor $M_1$ can shorten the fall time of the output signal $D_0$, this will increase the size of the entire memory. Thus, there is a problem in that it is difficult to shorten the fall time of the output signal $D_0$ without increasing the dimensions of the memory.

SUMMARY OF THE INVENTION

The present invention is implemented to solve the foregoing problem. It is therefore an object of the present invention to provide a memory capable of shortening the fall time of the output signal $D_0$ without increasing its dimensions.

Another object of the present invention is to provide a memory which can facilitate its fabrication process.

According to a first aspect of the present invention, there is provided a memory comprising: a read bit line to be charged; a first transistor connected to the read bit line, the first transistor constituting a first path for discharging the read bit line; and at least one second transistor connected in parallel with the first transistor, the second transistor constituting at least one second path for discharging the read bit line.

According to a second aspect of the present invention, there is provided a memory comprising: a plurality of read bit lines to be charged; a first transistor connected to at least one of the plurality of read bit lines, the first transistor constituting a first path for discharging the at least one of the plurality of read bit lines; and at least one second transistor connected in parallel with the first transistor, the second transistor constituting a second path across the plurality of read bit lines for discharging the at least one of the plurality of read bit lines to which the first transistor is connected.

According to a third aspect of the present invention, there is provided a memory comprising: at least two read bit lines to be charged; first transistors each connected to each one of the read bit lines, each of the first transistors constituting a first path for discharging each one of the read bit lines; second transistors each connected in series with each one of the read bit lines, each of the second transistors selecting a potential of the one of the read bit lines to which it is connected; and a second path provided in parallel with the first path for discharging one of the read bit lines, the second path being formed by interconnecting between the first transistors such that the second path includes a transistor which constitutes a path for discharging another of the read bit lines.

Here, the memory may further comprising a third transistors each connected in parallel with each one of the second transistors, each of the third transistor constituting a third path for discharging each one of the read bit lines.

DETAILED DESCRIPTION OF THE PREFERRED EMBODIMENTS

The invention will now be described with reference to the accompanying drawings.

Embodiment 1

Figure 1:
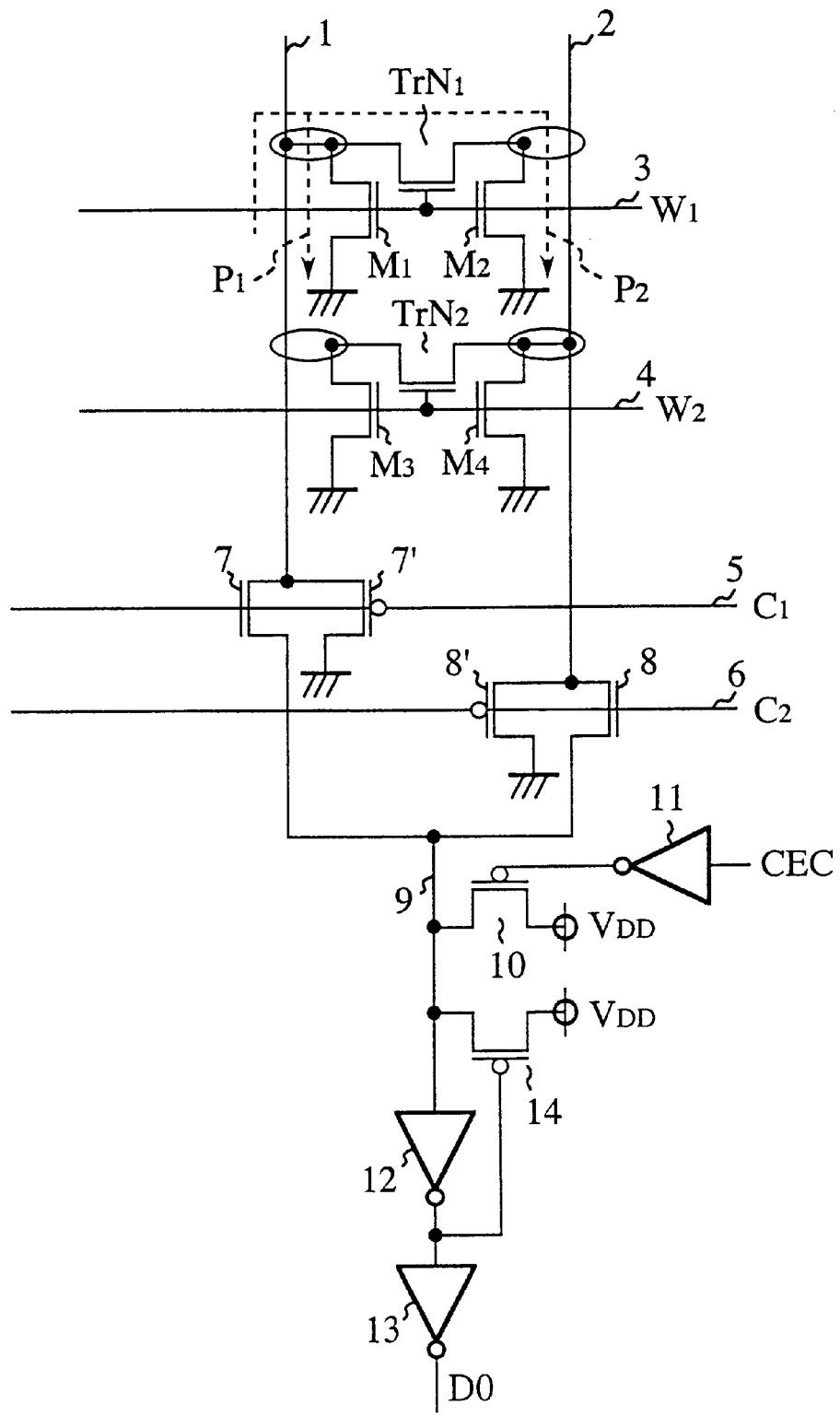
FIG. 1 is a circuit diagram showing a part of the circuit configuration of an embodiment 1 of a memory in accordance with the present invention.

FIG. 1 is a circuit diagram showing a part of a circuit configuration of an embodiment 1 of the memory in accordance with the present invention. In this figure, the reference numerals 1 and 2 designate read bit lines, 3 and 4 designate read word lines to which read word select signals $W_1$ and $W_2$ are applied, respectively. The reference numerals 5 and 6 designate column select lines to which column select signals $C_1$ and $C_2$ are applied. The reference numerals 7 and 8 designate transistors (second transistors) connected in series with the read bit lines 1 and 2 for selecting the read bit lines 1 and 2, respectively. The transistor 7 and 8 have their gates connected to the column select lines 5 and 6, respectively. The reference numerals 7' and 8' designate transistors (third transistors) for discharging an unselected read bit line. The transistors 7' and 8' have their sources connected to the drains of the transistors 7 and 8, their drains grounded, and their gates connected to the column select lines 5 and 6, respectively.

The reference numeral 9 designates a common read bit line with its first end connected to the read bit lines 1 and 2 in common, and 10 designates a transistor for supplying charge to the common read bit line 9. The transistor 10 has its drain connected to the common read bit line 9, and its source connected to a supply voltage is $V_{DD}$. The reference numeral 11 designates an inverter whose input terminal is supplied with a chip enable control signal CEC, and whose output terminal is connected to the gate of the transistor 10.

The reference numerals 12 and 13 designate inverters for amplifying the potential of the read bit lines 1 and 2. The inverter 12 has its input terminal connected to the common read bit line 9 and its output terminal to the input terminal of the inverter 13 which produces an output signal $D_0$ from its output terminal. The reference numeral 14 designates a transistor for holding the input potential to the inverter 12. The transistor 14 has its gate connected to the output terminal of the inverter 12, its drain connected to the input terminal of the inverter 12, and its source connected to the supply voltage $V_{DD}$.

The reference characters $M_1$–$M_4$ designate transistors constituting the memory. The transistors $M_1$–$M_4$ have their sources grounded. The transistors $M_1$ and $M_4$ have their drains connected to read bit lines 1 and 2, respectively, whereas the transistors $M_2$ and $M_3$ have their drains disconnected from the read bit lines 1 and 2. In addition, the transistors $M_1$ and $M_2$ have their gates connected to the read word line 3, and the transistors $M_3$ and $M_4$ have their gates connected to the read word line 4. The reference characters $TrN_1$ and $TrN_2$ designate transistors for promoting the discharge of the bit lines. The transistors $TrN_1$ and $TrN_2$ have their drain connected to the drains of the transistors $M_1$ and $M_4$, their sources connected to the drains of the transistors $M_2$ and $M_3$, and their gates connected to the read word lines 3 and 4, respectively. The reference characters $P_1$ and $P_2$ each designates a path for discharging the read bit line 1.

Figure 2:
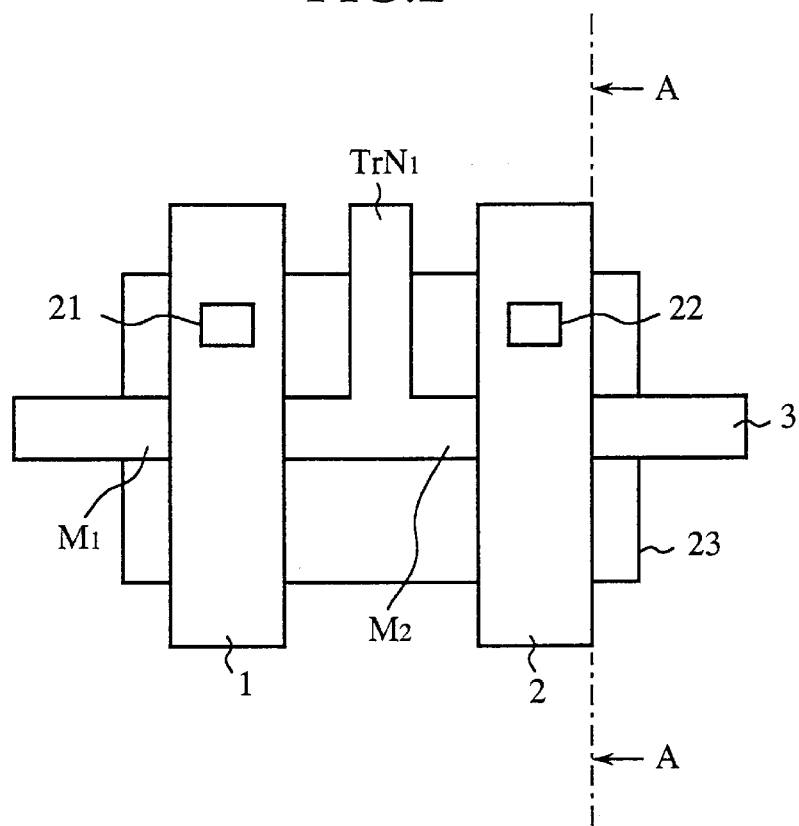
FIG. 2 is a plan view showing a partial physical structure of the embodiment 1 of the memory.
Figure 3:
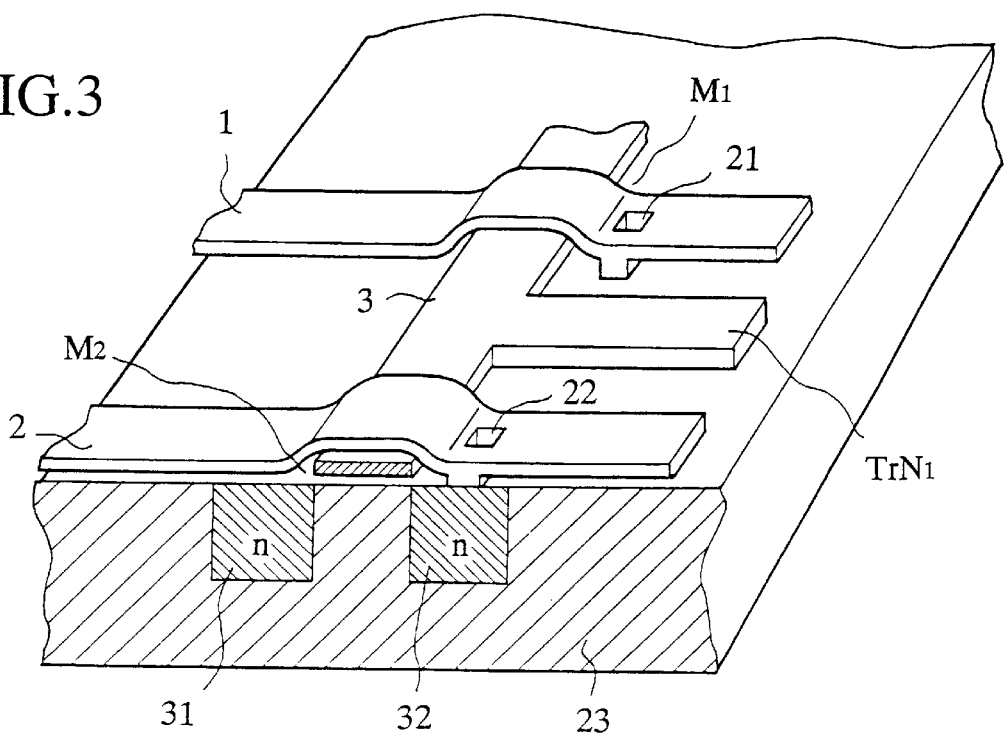
FIG. 3 is a longitudinal sectional perspective view taken along the line A—A of FIG. 2.

FIG. 2 is a plan view showing the physical structure of the embodiment 1 of the memory in part, and FIG. 3 is a longitudinal sectional perspective view taken along the line A—A of FIG. 2. In FIGS. 2 and 3, portions corresponding to those of FIG. 1 are designated by the same reference numerals, and the description thereof is omitted here.

In FIGS. 2 and 3, the reference numerals 21 and 22 designate contact holes for contacting the metallic read bit lines 1 and 2 with the diffusion regions of the transistors $M_1$ and $M_2$, respectively, 23 designates a substrate, and 31 and 32 designate the diffusion regions of the transistors $M_1$ and $M_2$. As shown in FIGS. 2 and 3, the transistor $TrN_1$ is provided in such a manner that it connects the drain of the transistor $M_1$ with that of the transistor $M_2$, and the transistor $TrN_2$ is provided in such a manner that it connects the drain of the transistor $M_3$ with that of the transistor $M_4$. Thus, since the transistors $TrN_1$ and $TrN_2$ are inserted between the existing transistors $M_1$ and $M_2$, and $M_3$ and $M_4$, they do not increase the layout area. In other words, they maintain the dimensions of the memory as those of the conventional memory.

Figure 4:
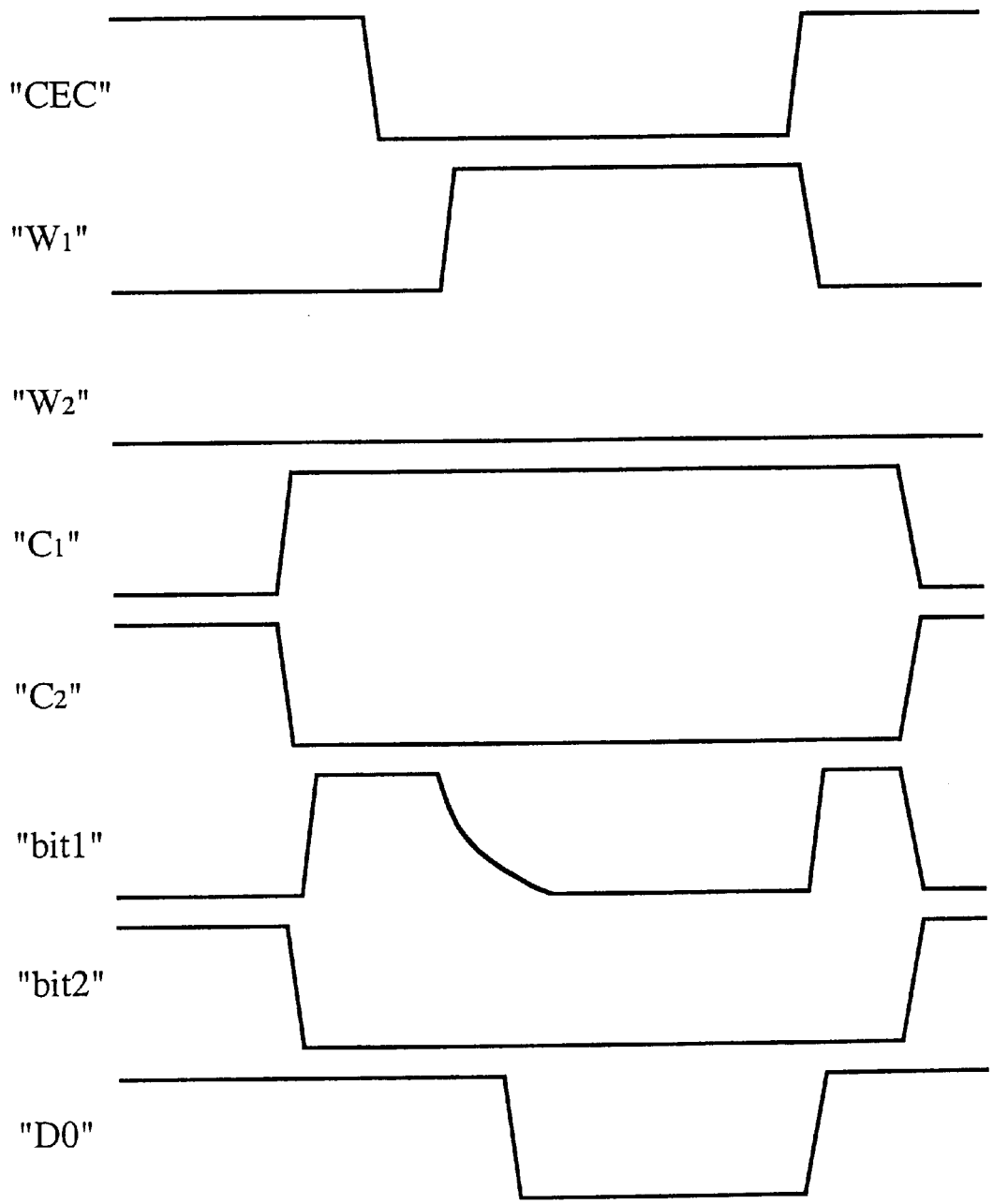
FIG. 4 is a timing chart illustrating waveforms input to or output from the embodiment 1 of the memory.

FIG. 4 is a timing chart illustrating waveforms of signals input to or output from the embodiment 1 of the memory. The operation of the memory will now be described with reference to the timing chart of FIG. 4.

First, the read bit line 2 is charged through transistors 10 and 8 during the interval in which the chip enable control signal CEC and the column select signal $C_2$ are placed at a high level, so that the potential of the read bit line 2, which will be denoted as bit2, is placed at the high level. In the course of this, the potential of the read bit line 1, denoted as bit1, is placed at a low level because the column select signal $C_1$ is placed at a low level and hence the transistor 7 is nonconducting and the transistor 7' is conducting. The output signal $D_0$ of the inverter 13 is at the high level because the high potential of the common read bit line 9 is inverted twice through the inverters 12 and 13.

When the column select signal $C_1$ rises to the high level and the column select signal $C_2$ falls to the low level in this state, the transistors 7 and 8' are turned on, and the transistors 7' and 8 are turned off. Thus, the potential bit1 rises to the high level, and the potential bit2 falls to the low level so that the read bit line 1 is charged.

When the chip enable control signal CEC falls in this state, the transistor 10 is turned off and the power supply to the common read bit line 9 is ceased. Subsequently, when the read word line select signal $W_1$ rises, the transistors $M_1$, $M_2$ and $TrN_1$ conduct. Hence, the read bit line 1 is discharged through the transistor $M_1$ (path $P_1$) and the transistors $TrN_1$ and $M_2$ (path $P_2$), and the potential bit1 and the output signal $D_0$ fall to the low level.

In this case, the read bit line 1 is discharged at a rate twice that of the conventional memory because the discharge is carried out simultaneously through the paths $P_1$ and $P_2$.

Next, when the chip enable control signal CEC rises, and the read word line select signal $W_1$ falls, the transistor 10 is turned on and the transistors $M_1$, $M_2$ and $TrN_1$ are turned off. Hence, the supply voltage $V_{DD}$ is supplied to the common read bit line 9 through the transistor 10. Since the transistors 7 and 8' are conducting and the transistors 7' and 8 are nonconducting in this case, the potential bit1 and the output signal $D_0$ rise to the high level, again.

When the column select signal $C_1$ falls to the low level and the column select signal $C_2$ rises to the high level in this state, the potentials bit1 falls to the low level and the potential bit2 rises to the high level, thus returning to the initial operating state of the embodiment as shown in FIG. 4.

As described above, according to the embodiment 1, the discharge time of the read bit line can be shortened without increasing the total size of the memory.

Embodiment 2

Figure 5:
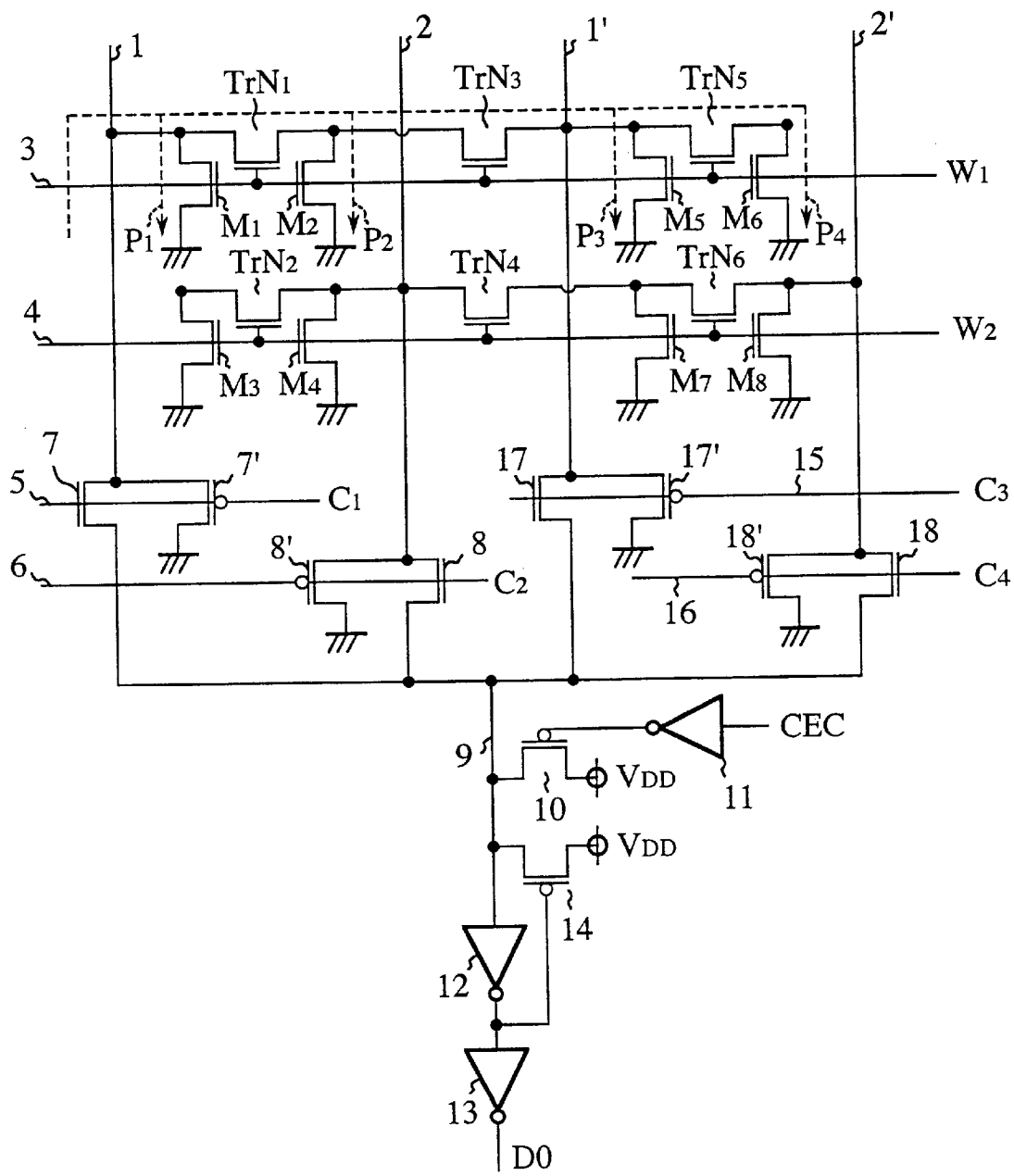
FIG. 5 is a circuit diagram showing a part of the circuit configuration of an embodiment 2 of the memory in accordance with the present invention.

FIG. 5 is a circuit diagram showing a part of the circuit configuration of an embodiment 2 of the memory in accordance with the present invention. In this figure, the components corresponding to those of the embodiment 1 as shown in FIG. 1 are designated by the same reference symbols, and the description thereof is omitted here. The embodiment 2 is characterized in that it further advances the discharge speed by providing additional two paths, thus increasing the number of the total discharge paths to four.

In FIG. 5, the reference numerals 1' and 2' designate read bit lines, 15 and 16 designate column select lines to which column select signals $C_3$ and $C_4$ are applied, respectively. The reference numerals 17 and 18 designate transistors connected in series with the read bit lines 1' and 2' for selecting the read bit lines 1' and 2', respectively. The transistors 17 and 18 have their gates connected to the column select lines 15 and 16, respectively. The reference numerals 17' and 18' designate transistors for discharging an unselected read bit line. The transistors 17' and 18' have their sources connected to the drains of the transistors 17 and 18, their drains grounded, and their gates connected to the column select lines 15 and 16, respectively.

The reference characters $M_5$–$M_8$ designate transistors constituting the memory. The transistors $M_5$–$M_8$ have their sources grounded. The transistors $M_5$ and $M_8$ have their drains connected to read bit lines 1' and 2', respectively, whereas the transistors $M_6$ and $M_7$ have their drains disconnected from the read bit lines 1' and 2'. In addition, the transistors $M_5$ and $M_6$ have their gates connected to the read word line 3, and the transistors $M_7$ and $M_8$ have their gates connected to the read word line 4. The reference characters $TrN_3$–$TrN_6$ designate transistors for promoting the rate of the discharge of the bit lines. The transistors $TrN_3$ and $TrN_4$ have their drain connected to the drains of the transistors $M_2$ and $M_4$, their sources connected to the drains of the transistors $M_5$ and $M_7$, and their gates connected to the read word lines 3 and 4, respectively. The transistors $TrN_5$ and $TrN_6$ have their drain connected to the drains of the transistors $M_5$ and $M_7$, their sources connected to the drains of the transistors $M_6$ and $M_8$, and their gates connected to the read word lines 3 and 4, respectively. The reference characters $P_3$ and $P_4$ each designates a path for discharging the read bit line 1.

Next, the operation of the embodiment 2 will be described.

This embodiment 2 has two pairs of read bit lines 1 and 2, and 1' and 2', each pair operating as the embodiment 1. Consider the case where only the column select signal $C_1$ is placed at the high level, leaving the remaining column select signals $C_2$–$C_4$ at the low level, and the read bit line 1 is discharged. In this case, the read word line 3 is connected to the entire gates of the transistors $M_1$, $M_2$, $M_5$, $M_6$, $TrN_1$, $TrN_3$ and $TrN_5$. Accordingly, all these transistors conduct when the read word line select signal $W_1$ rises, and hence the read bit line 1 is discharged through all the paths $P_1$–$P_4$. This means that the read bit line 1 is discharged at a rate four times that of the conventional memory. This holds true when discharging the remaining read bit lines 2, 1' and 2', each of which are discharged at the rate four times that of the conventional memory.

As described above, according to the embodiment 4, an advantage can be achieved that the read bit lines can be discharged at the rate four times that of the conventional memory.

Embodiment 3

Figure 6:
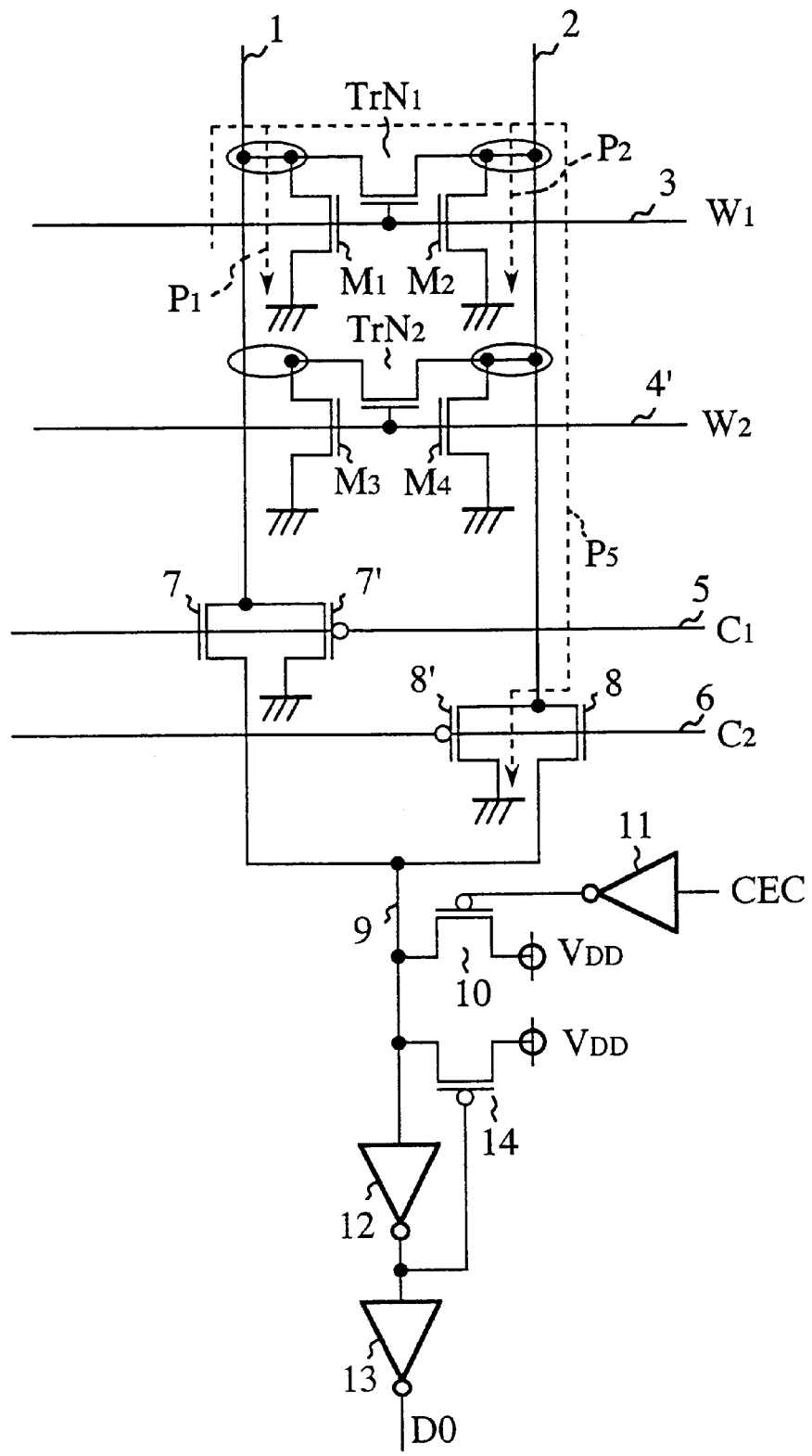
FIG. 6 is a circuit diagram showing a part of the circuit configuration of an embodiment 3 of the memory in accordance with the present invention.

FIG. 6 is a circuit diagram showing a part of the circuit configuration of an embodiment 3 of the memory in accordance with the present invention. In this figure, the components corresponding to those of the embodiment 1 as shown in FIG. 1 are designated by the same reference numerals, and the description thereof is omitted here. The embodiment 3 is characterized in its coding that the transistors $M_1$ and $M_2$ have their drains connected to the read bit lines 1 and 2. In this figure, $P_5$ designates one of the paths for discharging the read bit line.

Next, the operation of this embodiment will be described.

In this embodiment, the transistor 8' functions not only as a path for discharging the read bit line 2, but also as the path $P_5$ for discharging the read bit line 1. Specifically, as shown in the timing chart of FIG. 4, when the read word line select signal $W_1$ rises, the potential bit2 of the read bit line 2 has already been placed at the low level, and hence the read bit line 2 has no charge to be released. When the read word line select signal $W_1$ rises in this state, the transistor $M_2$ conducts and its drain is connected to the read bit line 2. Thus, the read bit line 1 is discharged through the path $P_5$ as well as through the paths $P_1$ and $P_2$, because the transistor 8' is conducting. This means that the read bit line 1 is discharged at the rate three times that of the conventional memory.

As described above, the embodiment 3 has an advantage of increasing the discharge speed to three times that of the conventional memory.

Embodiment 4

Figure 7:
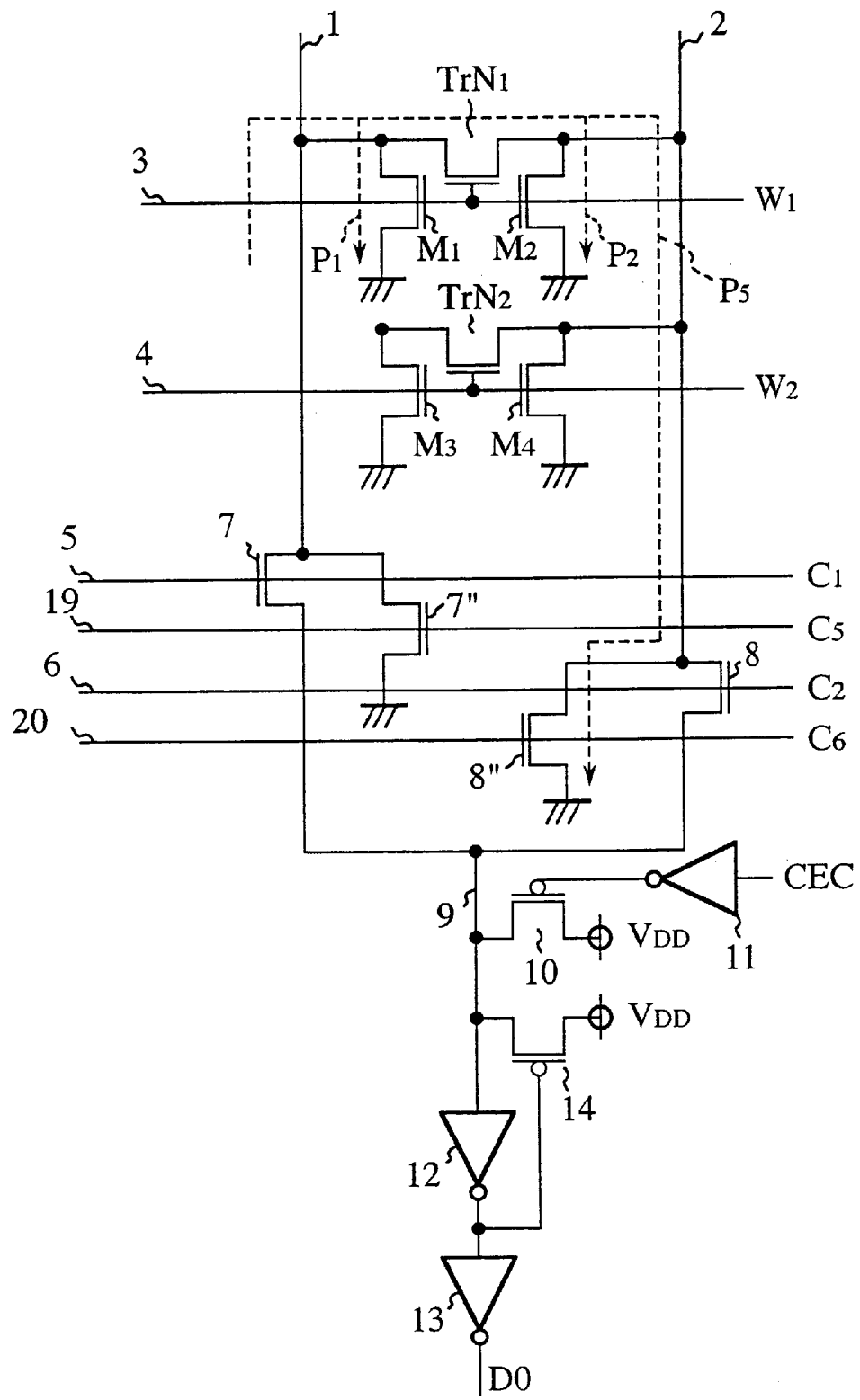
FIG. 7 is a circuit diagram showing a part of the circuit configuration of an embodiment 4 of the memory in accordance with the present invention.
Figure 8:
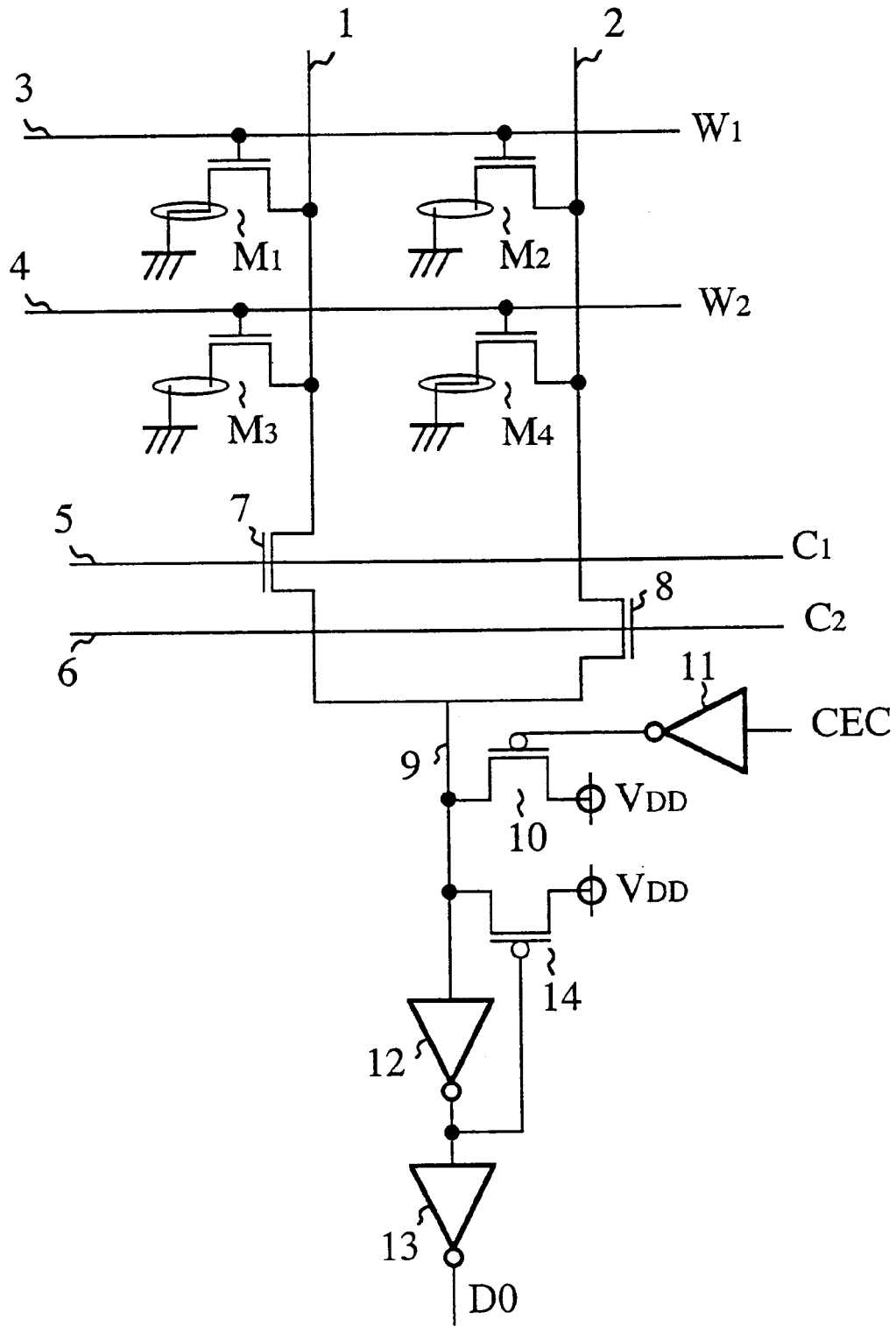
FIG. 8 is a circuit diagram showing a part of the circuit configuration of a conventional memory.
Figure 9:
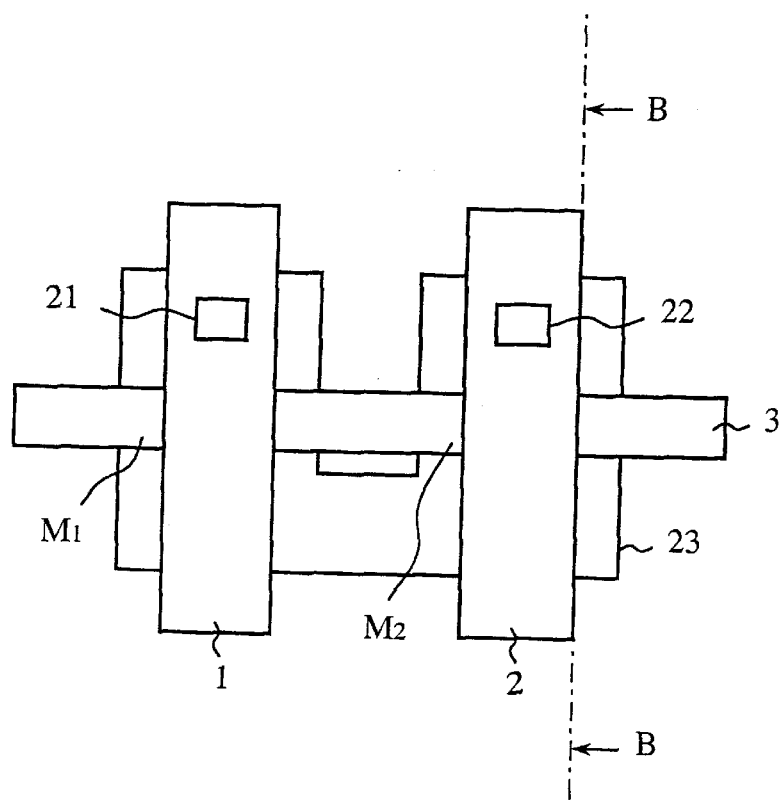
FIG. 9 is a plan view showing a partial physical structure of the conventional memory.
Figure 10:
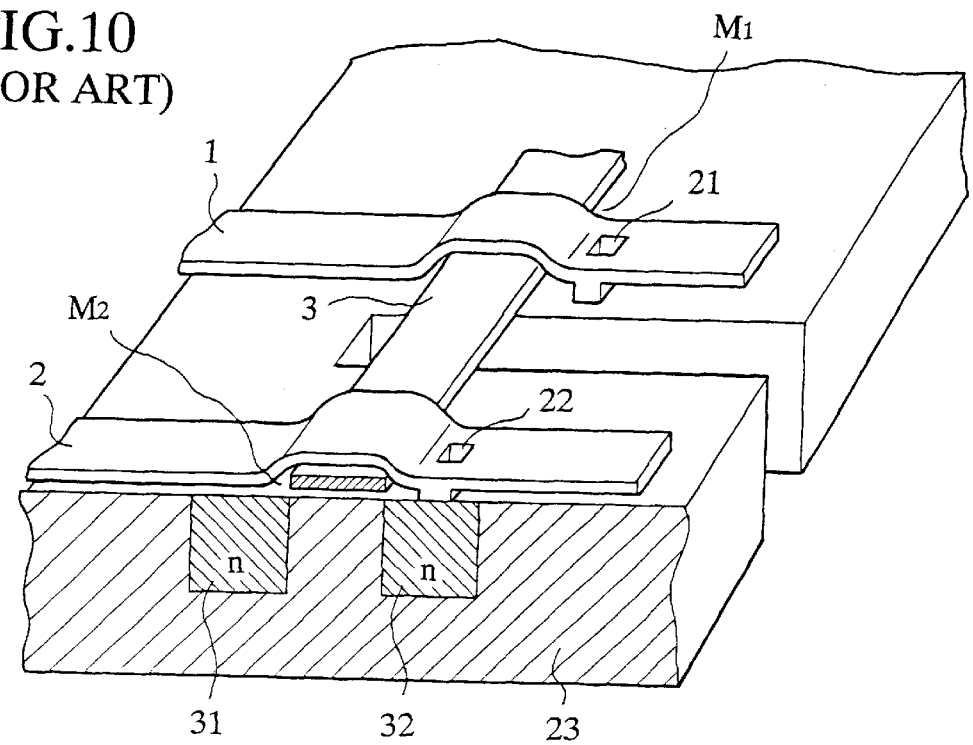
FIG. 10 is a longitudinal sectional perspective view taken along the line B—B of FIG. 9.
Figure 11:
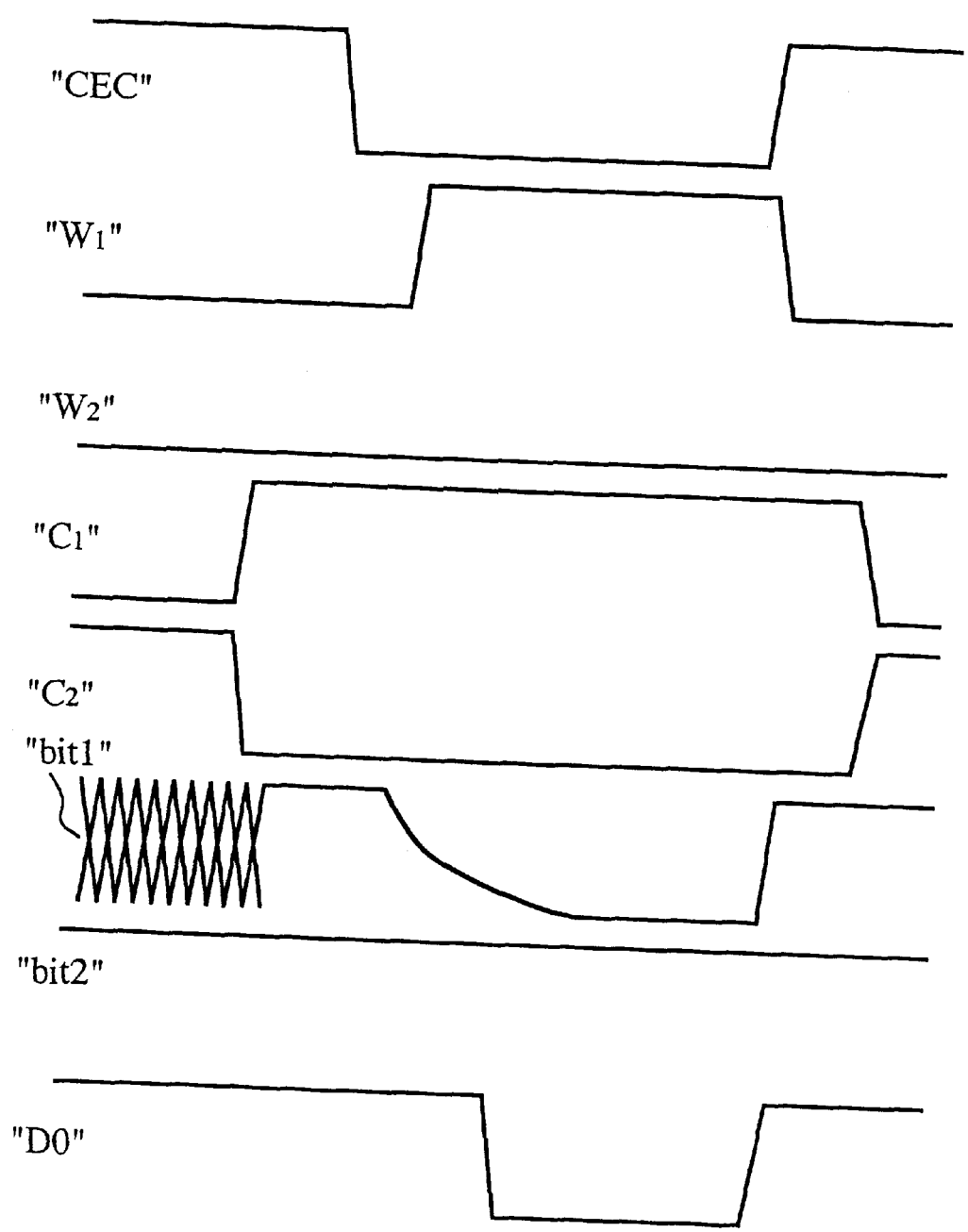
FIG. 11 is a timing chart illustrating waveforms input to or output from the conventional memory in FIG. 8.

FIG. 7 is a circuit diagram showing a part of the circuit configuration of an embodiment 4 of the memory in accordance with the present invention, in which the same components as those of the embodiment 3 as shown in FIG. 6 are designated by the same reference numerals, and the description thereof is omitted here.

In FIG. 7, the reference numerals 7" and 8" designate transistors (third transistors) for discharging the read bit lines 1 and 2, respectively. The transistors 7" and 8" have their drains connected to the drains of the transistor 7 and 8, and their sources grounded. The reference numerals 19 and 20 each designate a column select line. The column select lines 19 and 20, connected to the gates of the transistors 7" and 8", provides their gates with column select signals $C_5$ and $C_6$, respectively.

This embodiment 4 is characterized in that the transistors 7" and 8" are connected in parallel with the transistor 7 and 8, respectively. The transistors 7" and 8" are of the same conductivity type (N type in FIG. 7) as the transistor 7 and 8 connected to the read bit lines in series for selecting columns, and are supplied with the column select signals $C_5$ and $C_6$ independently of the transistor 7 and 8 for selecting columns. This simplifies the fabrication process of the memory, and shrinks its dimensions.

As described above, according to the embodiment 4, an advantage can be achieved of simplifying the fabrication process of the memory with its size reducing.

What is claimed is:

1. A memory with read bit line discharge circuit elements, comprising:

a read bit line to be charged;

a first transistor connected to said read bit line, said first transistor constituting a first path for discharging said read bit line; and at least one second transistor connected in parallel with said first transistor, said second transistor constituting at least one second path for discharging said read bit line.

2. A memory with read bit line discharge circuit elements, comprising:

a plurality of read bit lines to be charged;

a first transistor connected to at least one of said plurality of read bit lines, said first transistor constituting a first path for discharging said at least one of said plurality of read bit lines; and at least one second transistor connected in parallel with said first transistor, said second transistor constituting a second path across said plurality of read bit lines for discharging said at least one of said plurality of read bit lines to which said first transistor is connected.

3. A memory with read bit line discharge circuit elements, comprising:

at least two read bit lines to be charged;

first transistors each respectively connected to one of said read bit lines, each of said first transistors constituting a first path for discharging said respective one of said read bit lines;

second transistors each respectively connected in series with one of said read bit lines; and a second path provided in parallel with said first path for discharging one of said read bit lines, said second path being formed by interconnecting said first transistors such that said second path includes a transistor which constitutes a path for discharging another of said read bit lines.

4. The memory as claimed in claim 3, further comprising a third transistor each connected in parallel with each one of said second transistors, each of said third transistor constituting a third path for discharging one of said read bit lines.

\* \* \* \* \*